(12) United States Patent
Koo

(10) Patent No.: US 7,391,248 B2
(45) Date of Patent: Jun. 24, 2008

(54) DUTY CYCLE CORRECTOR OF DELAY LOCKED LOOP

(75) Inventor: Cheul Hee Koo, Icheon-si (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 36 days.

(21) Appl. No.: 11/160,330

(22) Filed: Jun. 20, 2005

(65) Prior Publication Data

US 2006/0114041 A1   Jun. 1, 2006

(30) Foreign Application Priority Data

Dec. 1, 2004   (KR) .................. 10-2004-0099787

(51) Int. Cl.
*H03K 7/08* (2006.01)
(52) U.S. Cl. .................. 327/175; 327/175
(58) Field of Classification Search .............. None
See application file for complete search history.

(56) References Cited

U.S. PATENT DOCUMENTS

| | | | |
|---|---|---|---|
| 5,572,158 A | 11/1996 | Lee et al. | 327/175 |
| 6,509,771 B1 | 1/2003 | Atallah et al. | 327/175 |
| 6,525,581 B1* | 2/2003 | Choi | 327/175 |
| 6,853,225 B2* | 2/2005 | Lee | 327/158 |
| 6,897,693 B2* | 5/2005 | Kim | 327/158 |
| 7,005,904 B2* | 2/2006 | Minzoni | 327/175 |
| 2005/0093600 A1* | 5/2005 | Kwak | 327/161 |

FOREIGN PATENT DOCUMENTS

| JP | 2001-352234 A | 12/2001 |
|---|---|---|
| JP | 15-110411 | 4/2003 |

\* cited by examiner

*Primary Examiner*—Cassandra Cox
(74) *Attorney, Agent, or Firm*—Marshall, Gerstein & Borun LLP

(57) ABSTRACT

Provided is a digital duty cycle corrector capable of generating a clock signal with the rate of duty 50:50, by means of three or more duty cycle correction circuits assigning different weight values to first and second clock signals that are different in duty cycle each other in order to reduce a phase difference between the first and second clock signals, and one or more duty cycle correction circuits assigning the same weight value to the first and second clock signals in order to eliminate a phase difference between the first and second clock signals.

18 Claims, 3 Drawing Sheets

VOLTAGE ⟶ TIME

DUTY CYCLE CORRECTOR OF DELAY LOCKED LOOP

FIELD OF THE INVENTION

The present invention relates to a digital duty cycle corrector of a delay locked loop and specifically, to a digital duty cycle corrector revising duty of an input clock signal in the rate of 50:50.

DISCUSSION OF RELATED ART

There are general ways of correcting duty of a clock signal. For example, one is the method of correcting duty of a clock signal by using an analogue duty cycle correction circuit, and the other is the method of correcting duty by using a digital duty correction circuit with a synchronous delay loop.

FIG. 1 is a circuit diagram illustrating a conventional duty cycle corrector, and FIG. 2 is a timing diagram showing waveforms of signals shown in FIG. 1.

Referring to FIG. 1, the digital duty correction circuit includes input buffers 110 and 120, a duty cycle corrector 130, and an output circuit 140.

The input buffer 110 temporarily stores and transfers a clock signal CLK, while the input buffer 120 temporarily stores and transfers a clock signal CLKZ.

The duty cycle corrector 130 includes inverters 131 and 132 outputting a clock signal OUTX from mixing output signals of the input buffers 110 and 120, and inverters 133 and 134 outputting a clock signal OUTY from mixing output signals of the input buffers 110 and 120.

The output circuit 140 includes an inverter 141 converting the clock signal OUTX to output a clock signal OUT, and an inverter 142 converting the clock signal OUTY to output a clock signal OUTZ.

Such a digital duty cycle correction circuit is configured with an extended fan-out (here, larger than 6), which makes the clock signals CLK and CLKZ be mixed without distortion by lengthening the rising times of the clock signals CLK and CLKZ (refer to FIG. 2). In other words, the rising or falling times of the clock signals CLK and CLKZ become longer so as to prevent distortion of the clock signals generated from mixing the clock signals CLK and CLKZ.

However, if the rising or falling times of the clock signals CLK and CLKZ are lengthened, it becomes weakened against power supply noises. And, if an operating frequency increases, the rising or falling times of the clock signals CLK and CLKZ becomes longer than a half period of the clock signal. Then, it is impossible to correct the duty because the clock signals CLK and CLKZ are disable to fully swing up and down. As a result, there is a problem that the conventional duty cycle corrector becomes useless when the frequency of the clock signals CLK and CLKZ increase.

SUMMARY OF THE INVENTION

The present invention is directed to solve the problem, providing a digital duty cycle corrector capable of a clock signal having duty of 50:50 by assigning different weight values to first and second clock signals that are different in duty cycle and last assigning the same weight value to the first and second clock signals.

In order to achieve the direction, a duty cycle corrector of a delay locked loop, according to a preferred embodiment of the present invention, is comprised of: more than three duty cycle correction circuits assigning different weight values to first and second clock signals that are different in duty cycle, reducing a phase difference between the first and second clock signals; and at least one duty cycle correction circuits assigning the same weight value to the first and second clock signals, eliminating a phase difference between the first and second clock signals.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION OF PREFERRED EMBODIMENTS

Figure 1:
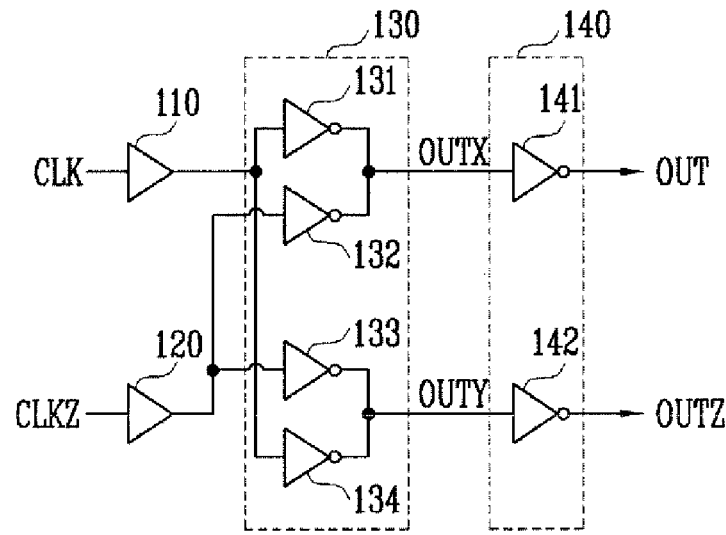
FIG. 1 is a circuit diagram illustrating a conventional duty cycle corrector.
Figure 2:
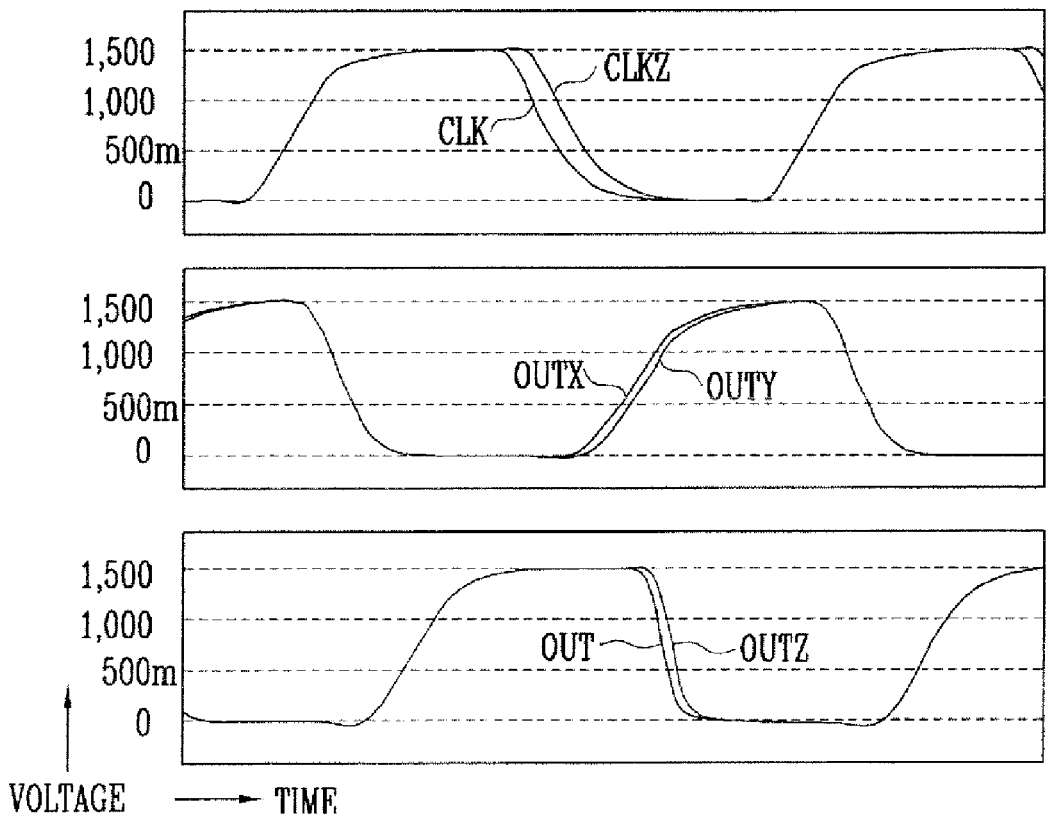
FIG. 2 is a timing diagram showing waveforms of signals shown in FIG. 1.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numerals refer to like elements throughout the specification.

Figure 3:
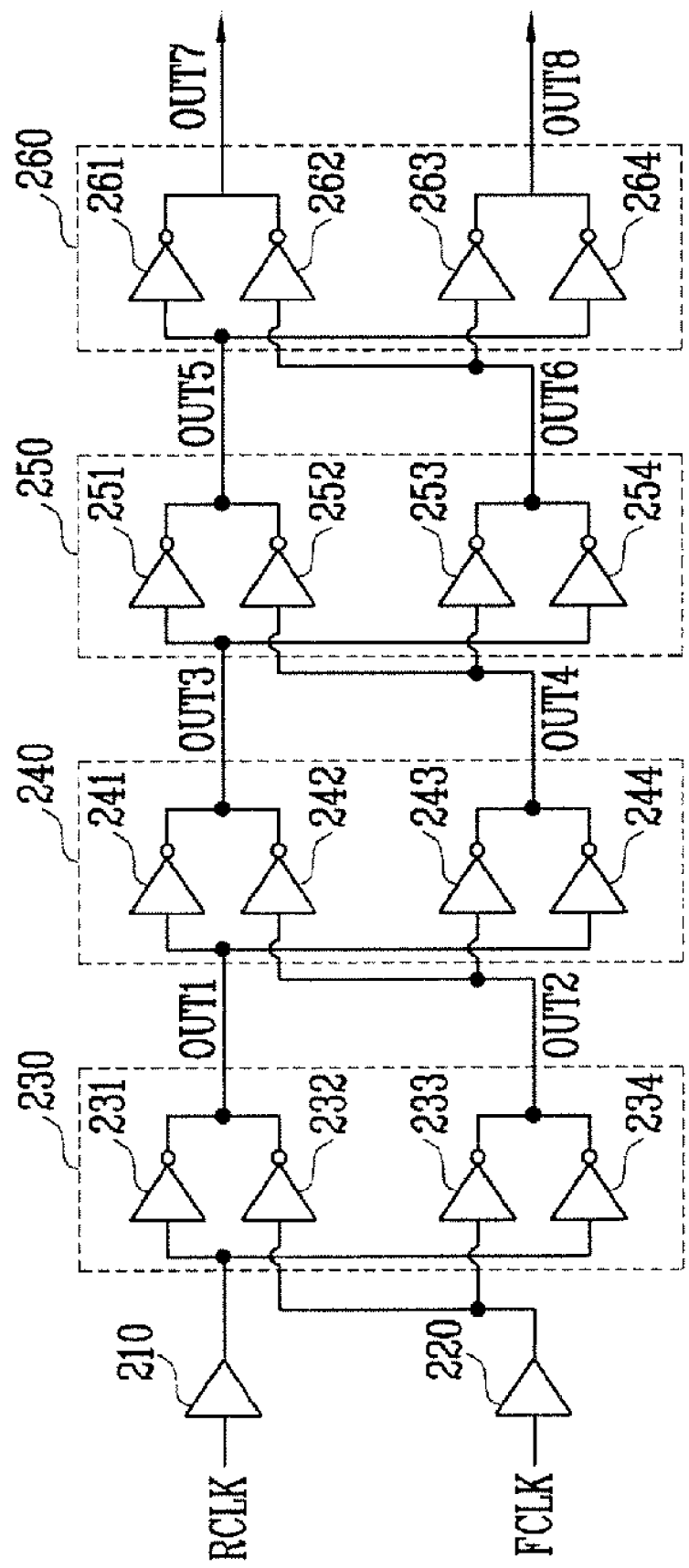
FIG. 3 is a circuit diagram illustrating a duty cycle corrector according to a preferred embodiment of the present invention.
Figure 4:
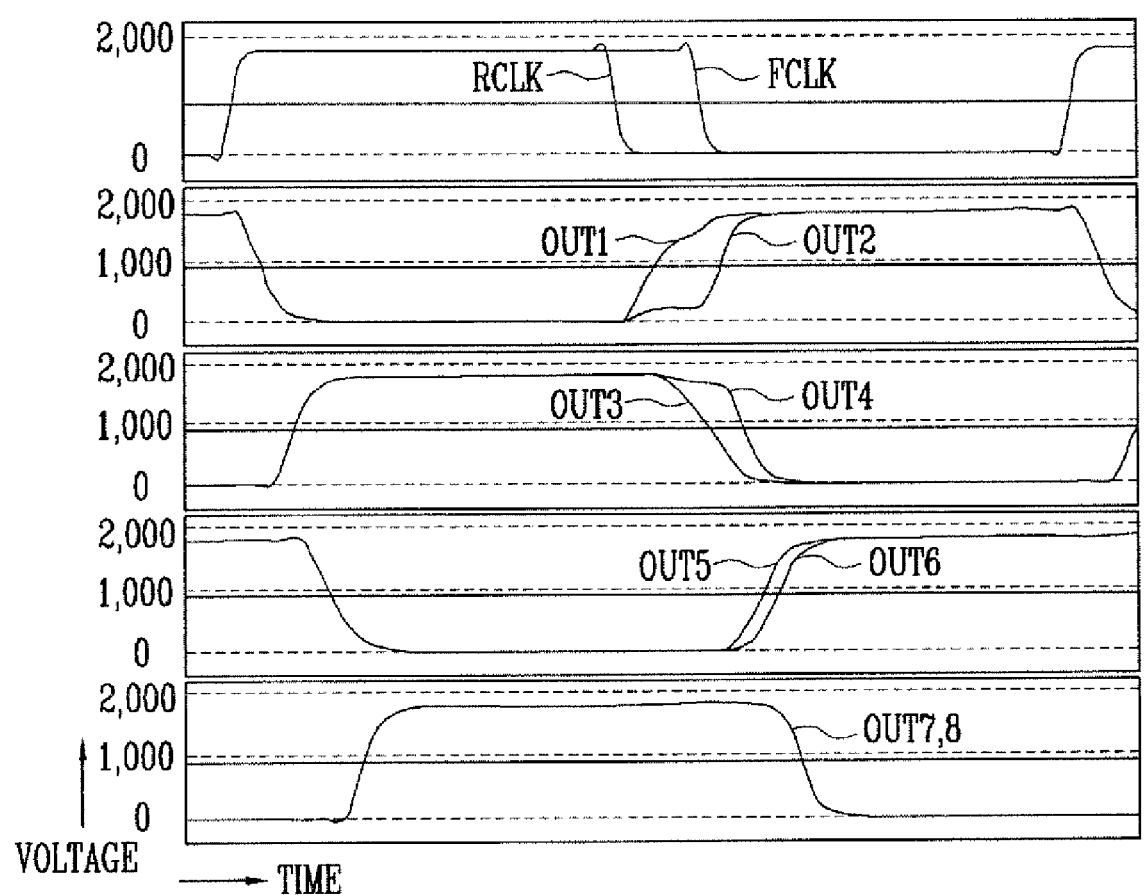
FIG. 4 is a timing diagram showing waveforms of signals shown in FIG. 3.

FIG. 3 is a circuit diagram illustrating a duty cycle corrector according to a preferred embodiment of the present invention, and FIG. 4 is a timing diagram showing waveforms of signals shown in FIG. 3, to which clock signals TCLK and FCLK with the same rising phase difference and a large falling phase difference are applied.

Referring to FIG. 3, the digital duty cycle corrector shortens rising or falling times of the clock signals RCLK and FCLK with a small fan-out for example 2 or 3.

This digital duty cycle corrector is comprised of input buffers 210 and 220, first through third duty cycle correction circuits 230, 240, and 250 gradually reducing a phase difference between the clock signals RCLK and FCLK by assigning different weight values to the clock signals RCLK and FCLK, and a fourth duty cycle correction circuit 260 finally eliminating a phase difference between the clock signals RCLK and FCLK by assigning the same weight value to the clock signals RCLK and FCLK.

First, the input buffer 210 is composed of two inverters serially connected to each other, temporarily storing and outputting the clock signal RCLK. The input buffer FCLK is composed of two inverters serially connected to each other, temporarily storing and outputting the clock signal FCLK.

The first duty cycle correction circuit 230 is comprised of an inverter 231 with an enlarged MOS structure to make a weight value of the clock signal RCLK larger, an inverter 232 with a shrunken MOS structure to make the clock signal FCLK smaller, an inverter 233 with an enlarged MOS structure to make a weight value of the clock signal FCLK larger, and an inverter 234 with a shrunken MOS structure to make the clock signal RCLK smaller.

If the inverters 231 and 233 to increase the weight values of the clock signals RCLK and FCLK are constructed with a PMOS and an NMOS sized in the ratio 8:4, the inverters 232 and 234 to decrease the weight values of the clock signals FCLK and RCLK are constructed with a PMOS and an NMOS sized in the ratio 4:2.

The inverters 231 and 232 generate a mixed clock signal OUT1 by mixing the clock signals RCLK and FCLK after increasing the weight value of the clock signal RCLK while decreasing the weight value of the clock signal FCLK. The inverters 233 and 234 generate a mixed clock signal OUT2 by mixing the clock signals RCLK and FCLK after increasing the weight value of the clock signal FCLK while decreasing the weight value of the clock signal RCLK. From these operations, the mixed clock signal OUT1 becomes similar to the clock signal RCLK, while the mixed clock signal OUT2 becomes similar to the clock signal FCLK. But, a phase difference between the mixed clock signals OUT1 and OUT2 is smaller than that between the clock signals RCLK and FCLK (refer to the second waveform graph of FIG. 4).

The second duty cycle correction circuit 240 is comprised of an inverter 241 with an enlarged MOS structure to make a weight value of the mixed clock signal OUT1 larger, an inverter 242 with a shrunken MOS structure to make the mixed clock signal OUT2 smaller, an inverter 243 with an enlarged MOS structure to make a weight value of the mixed clock signal OUT2 larger, and an inverter 244 with a shrunken MOS structure to make the mixed clock signal OUT1 smaller.

If the inverters 241 and 243 to increase the weight values of the mixed clock signals OUT1 and OUT2 are constructed with a PMOS and an NMOS sized in the ratio 8:4, the inverters 242 and 244 to decrease the weight values of the mixed clock signals OUT2 and OUT1 are constructed with a PMOS and an NMOS sized in the ratio 4:2.

The inverters 241 and 242 generate a mixed clock signal OUT3 by mixing the mixed clock signals OUT1 and OUT2 after increasing the weight value of the mixed clock signal OUT1 while decreasing the weight value of the mixed clock signal OUT2. The inverters 243 and 244 generate a mixed clock signal OUT4 by mixing the mixed clock signals OUT1 and OUT2 after increasing the weight value of the mixed clock signal OUT2 while decreasing the weight value of the mixed clock signal OUT1. From these operations, the mixed clock signal OUT3 becomes similar to the mixed clock signal OUT1, while the mixed clock signal OUT4 becomes similar to the mixed clock signal OUT2. But, a phase difference between the mixed clock signals OUT3 and OUT4 is smaller than that between the mixed clock signals OUT1 and OUT2 (refer to the third waveform graph of FIG. 4).

The third duty cycle correction circuit 250 is comprised of an inverter 251 with an enlarged MOS structure to make a weight value of the mixed clock signal OUT3 larger, an inverter 252 with a shrunken MOS structure to make the mixed clock signal OUT4 smaller, an inverter 253 with an enlarged MOS structure to make a weight value of the mixed clock signal OUT4 larger, and an inverter 254 with a shrunken MOS structure to make the mixed clock signal OUT3 smaller.

If the inverters 251 and 253 to increase the weight values of the mixed clock signals OUT3 and OUT4 are constructed with a PMOS and an NMOS sized in the ratio 8:4, the inverters 242 and 244 to decrease the weight values of the mixed clock signals OUT4 and OUT3 are constructed with a PMOS and an NMOS sized in the ratio 4:2.

The inverters 251 and 252 generate a mixed clock signal OUT5 by mixing the mixed clock signals OUT3 and OUT4 after increasing the weight value of the mixed clock signal OUT3 while decreasing the weight value of the mixed clock signal OUT4. The inverters 253 and 254 generate a mixed clock signal OUT6 by mixing the mixed clock signals OUT3 and OUT4 after increasing the weight value of the mixed clock signal OUT4 while decreasing the weight value of the mixed clock signal OUT3. From these operations, the mixed clock signal OUT5 becomes similar to the mixed clock signal OUT3, while the mixed clock signal OUT6 becomes similar to the mixed clock signal OUT4. But, a phase difference between the mixed clock signals OUT5 and OUT6 is smaller than that between the mixed clock signals OUT3 and OUT4 (refer to the fourth waveform graph of FIG. 4).

The fourth duty cycle correction circuit 260 is comprised of inverters 261, 262, 263, and 264 each constructed in the size ratio 5:5, in order to make weight values of the mixed clock signals OUT5 and OUT6 be equal.

That is, the ratio of PMOS and NMOS of each of the inverters 261~264 in size is designed to be 5:5.

The inverters 261 and 262 generate a mixed clock signal OUT7 by mixing the mixed clock signals OUT5 and OUT6 after making the weight values of the mixed clock signals OUT5 and OUT6 identical. The inverters 263 and 264 generate a mixed clock signal OUT8 by mixing the mixed clock signals OUT5 and OUT6 after making the weight values of the mixed clock signals OUT5 and OUT6 identical. The mixed clock signals OUT7 and OUT8 are conditioned without a phase difference (refer to the fifth waveform graph of FIG. 4), having the duty 50:50 of logical high and low.

As aforementioned, the present invention is advantageous to set the duty ratio of input clock signals with different duty cycles even in a wide frequency range, for example by differentiating weight values of the first and second clock signals different in duty cycles and finally assigning the same weight value to the first and second clock signals.

Moreover, it is possible to overcome the problem weak in power noises by reducing a rising or falling time of a clock signal.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed as new and desired to be protected by Letters Patent of the United States is:

1. A duty cycle corrector of a delay locked loop for correcting a duty cycle of a clock signal, comprising:
    a first duty cycle correction unit including three or more duty cycle correction circuits, assigning different weight values to first and second clock signals that are different in duty cycle, and outputting mixed first and second signals having a phase difference smaller than that of the first and second clock signals; and
    a second duty cycle correction unit assigning the same weight value to the mixed first and second signals, and eliminating the phase difference.

2. The duty cycle corrector as set forth in claim 1, wherein the final duty cycle correction circuit of the three or more duty cycle correction circuits comprises:
    a first mixer generating the mixed first signal, including a first inverter with an enlarged MOS structure to increase a weight value of the first clock signal and a second inverter with a shrunken MOS structure to decrease a weight value of the second clock signal; and
    a second mixer generating the mixed second signal, including a third inverter with an enlarged MOS structure to increase the weight value of the second clock signal and a fourth inverter with a shrunken MOS structure to decrease the weight value of the first clock signal.

3. The duty cycle corrector as set forth in claim 1, the first duty cycle correction unit comprises:
a first duty cycle correction circuit assigning different weight values to the first and second clock signals that are different in duty cycle, and outputting third and fourth clock signals having a phase difference smaller than that of the first and second clock signals;
a second duty cycle correction circuit assigning different weight values to the third and fourth clock signals and outputting fifth and sixth clock signals having a phase difference smaller than that of the third and fourth clock signals; and
a third duty cycle correction circuit assigning different weight values to the fifth and sixth clock signals and outputting seventh and eighth clock signals having a phase difference smaller than that of the fifth and sixth clock signals.

4. The duty cycle corrector as set forth in claim 3, wherein the first duty cycle correction circuit comprises:
a first mixer generating the third clock signal, including a first inverter with an enlarged MOS structure to increase a weight value of the first clock signal and a second inverter with a shrunken MOS structure to decrease a weight value of the second clock signal; and
a second mixer generating the fourth clock signal, including a third inverter with an enlarged MOS structure to increase the weight value of the second clock signal and a fourth inverter with a shrunken MOS structure to decrease the weight value of the first clock signal.

5. The duty cycle corrector as set forth in claim 4, wherein the second duty cycle correction circuit comprises:
a third mixer generating the fifth clock signal, including a fifth inverter with an enlarged MOS structure to increase a weight value of the third clock signal and a sixth inverter with a shrunken MOS structure to decrease a weight value of the fourth clock signal; and
a fourth mixer generating the sixth clock signal, including a seventh inverter with an enlarged MOS structure to increase the weight value of the fourth clock signal and an eighth inverter with a shrunken MOS structure to decrease the weight value of the third clock signal.

6. The duty cycle corrector as set forth in claim 5, wherein the third duty cycle correction circuit comprises:
a fifth mixer generating the seventh clock signal, including a ninth inverter with an enlarged MOS structure to increase a weight value of the fifth clock signal and a tenth inverter with a shrunken MOS structure to decrease a weight value of the sixth clock signal; and
a sixth mixer generating the eighth clock signal, including an eleventh inverter with an enlarged MOS structure to increase the weight value of the sixth clock signal and a twelfth inverter with a shrunken MOS structure to decrease the weight value of the fifth clock signal.

7. The duty cycle corrector as set forth in claim 1, wherein the second duty cycle correction unit assigns the same weight value to the mixed first and second signals, generating third and fourth signals with a duty ratio of 50:50.

8. The duty cycle corrector as set forth in claim 6, wherein the second duty cycle correction unit comprises:
a seventh mixer generating a ninth signal, including a thirteenth inverter receiving the seventh clock signal and a fourteenth inverter receiving the eighth clock signal; and
a eighth mixer generating a tenth signal, including a fifteenth inverter receiving the eighth clock signal and a sixteenth inverter receiving the seventh clock signal.

9. The duty cycle corrector as set forth in claim 8, wherein the thirteenth through sixteenth inverters have the same size ratio in MOS structure.

10. The duty cycle corrector as set forth in claim 1, wherein a fan-out is smaller to reduce rising or falling times of the first and second clock signals.

11. A duty cycle corrector of a delay locked loop for correcting a duty cycle of a clock signal, comprising:
a first duty cycle correction circuit assigning different weight values to first and second clock signals that are different in duty cycle, and outputting third and fourth clock signals having a phase difference smaller than that of the first and second clock signals;
a second duty cycle correction circuit assigning different weight values to the third and fourth clock signals and outputting fifth and sixth clock signals having a phase difference smaller than that of the third and fourth clock signals;
a third duty cycle correction circuit assigning different weight values to the fifth and sixth clock signals and outputting seventh and eighth clock signals having a phase difference smaller than that of the fifth and sixth clock signals;
a fourth duty cycle correction circuit assigning the same weight value to the seventh and eighth signals and outputting ninth and tenth signals having an eliminated phase difference.

12. The duty cycle corrector as set forth in claim 11, wherein the first duty cycle correction circuit comprises:
a first mixer generating the third clock signal, including a first inverter with an enlarged MOS structure to increase a weight value of the first clock signal and a second inverter with a shrunken MOS structure to decrease a weight value of the second clock signal; and
a second mixer generating the fourth clock signal, including a third inverter with an enlarged MOS structure to increase the weight value of the second clock signal and a fourth inverter with a shrunken MOS structure to decrease the weight value of the first clock signal.

13. The duty cycle corrector as set forth in claim 12, wherein the second duty cycle correction circuit comprises:
a third mixer generating the fifth clock signal, including a fifth inverter with an enlarged MOS structure to increase a weight value of the third clock signal and a sixth inverter with a shrunken MOS structure to decrease a weight value of the fourth clock signal; and
a fourth mixer generating the sixth signal, including a seventh inverter with an enlarged MOS structure to increase the weight value of the fourth clock signal and an eighth inverter with a shrunken MOS structure to decrease the weight value of the third clock signal.

14. The duty cycle corrector as set forth in claim 13, wherein the third duty cycle correction circuit comprises:
a fifth mixer generating the seventh clock signal, including a ninth inverter with an enlarged MOS structure to increase a weight value of the fifth clock signal and a tenth inverter with a shrunken MOS structure to decrease a weight value of the sixth clock signal; and
a sixth mixer generating the eighth clock signal, including an eleventh inverter with an enlarged MOS structure to increase the weight value of the sixth clock signal and a twelfth inverter with a shrunken MOS structure to decrease the weight value of the fifth clock signal.

15. The duty cycle corrector as set forth in claim 14, wherein the fourth duty cycle correction circuit comprises:
- a seventh mixer generating the ninth clock signal, including a thirteenth inverter receiving the seventh clock signal and a fourteenth inverter receiving the eighth clock signal; and
- a eighth mixer generating the tenth clock signal, including an fifteenth inverter receiving the eighth clock signal and a sixteenth inverter receiving the seventh clock signal.

16. The duty cycle corrector as set forth in claim 11, wherein the fourth duty cycle correction circuit assigns the same weight value to the seventh and eighth clock signals, generating ninth and tenth clock signals with a duty ratio of 50:50.

17. The duty cycle corrector as set forth in claim 11, wherein a fan-out is smaller to reduce rising or falling times of the first and second clock signals.

18. The duty cycle corrector as set forth in claim 15, wherein the thirteenth through sixteenth inverters have the same size ratio in MOS structure.

* * * * *